United States Patent [19]

Lambe et al.

[11] 4,160,931

[45] Jul. 10, 1979

[54] SOLID STATE SOURCE OF RADIANT ENERGY HAVING A CONTROLLABLE FREQUENCY SPECTRA CHARACTERISTIC

[75] Inventors: John J. Lambe, Birmingham; Shaun L. McCarthy, Ann Arbor, both of Mich.

[73] Assignee: Ford Motor Company, Dearborn, Mich.

[21] Appl. No.: 896,408

[22] Filed: Apr. 14, 1978

Related U.S. Application Data

[63] Continuation-in-part of Ser. No. 836,624, Sep. 26, 1977.

[51] Int. Cl.$^2$ .................... H01L 33/00; H05B 33/02
[52] U.S. Cl. .................................. 313/498; 313/116
[58] Field of Search ............... 313/116, 499, 500, 483, 313/498

[56] References Cited

U.S. PATENT DOCUMENTS

| | | |
|---|---|---|
| 3,056,073 | 9/1962 | Mead |
| 3,116,427 | 12/1963 | Giaever .................... 313/498 X |
| 3,405,374 | 10/1968 | Dayem et al. |
| 3,501,676 | 3/1970 | Adler et al. .................. 313/500 X |
| 3,780,357 | 12/1973 | Haitz ........................ 313/499 X |

OTHER PUBLICATIONS

"Light Emissions from Inelastic Electron Tunneling," by J. Lambe et al., *Physical Review Letters*, vol. 37, No. 14, Oct. 1976, pp. 923-925.
"Electron Emission, Electroluminescence, and Voltage-Controlled Negative Resistance in Al-Al$_2$O$_3$-Au Diodes," by T. W. Hickmott, *Journal of Applied Physics*, vol. 36, No. 6, Jun. 1965, pp. 1885-1896.
"Correlation between Electroluminescence and Electron Emission of Thin Metal-Oxide-Metal Sandwiches," by J. F. DeLord et al., *Applied Physics Letters*, vol. 11, No. 9, Nov. 1967, pp. 287-289.
"Comments on Correlation between Electroluminescence and Electron Emission of Thin Metal-Oxide-Metal Sandwiches," by H. Kanter, *Applied Physics Letters*, vol. 12, No. 8, Apr. 1968, pp. 243-244.
"Electroluminescence in Al-Al$_2$O$_3$-Au Diodes," by W. Pong et al., *J. Appl. Phys.*, vol. 46, No. 5, May 1975, pp. 2310-2312.
"Plasma Radiation from Tunnel Junctions," by T. L. Hwang et al., *Phys. Rev. Letters*, vol. 36, No. 7, Feb. 1976, pp. 379-382.

*Primary Examiner*—Palmer C. Demeo
*Attorney, Agent, or Firm*—Paul K. Godwin, Jr.; Clifford L. Sadler

[57] ABSTRACT

A solid state source of radiant energy having a characteristic frequency spectra with a high frequency cutoff $v_{co}$, which is a function of the applied voltage value. The source is a metal-insulator-metal tunnel junction, wherein the insulator layer is relatively thin with respect to the metal layers and inelastic tunneling occurs. The improvements comprise small metal particles placed close to the tunnel junction surface to function as scattering centers for externally coupling surface plasmon modes.

6 Claims, 4 Drawing Figures

SOLID STATE SOURCE OF RADIANT ENERGY HAVING A CONTROLLABLE FREQUENCY SPECTRA CHARACTERISTIC

CROSS-REFERENCE TO RELATED APPLICATION

This is a Continuation-In-Part of currently pending U.S. patent application Ser. No. 836,624 filed Sept. 26, 1977.

BACKGROUND OF THE INVENTION

1. Field of the Invention

The present invention relates to a solid state device, which responds to values of applied voltage by emitting radiant energy having a known frequency spectra with a predictable high frequency cutoff value $v_{co}$ for each value of applied voltage. More particularly, the present invention relates to an external mechanism for photon-plasmon coupling that allows energy to be radiated at room temperature having high intensity and stability.

2. Description of the Prior Art

Numerous electroluminescent solid state devices have been developed, which emit relatively narrow bands of light in response to applied voltages. Such devices are commonly referred to as light emitting diodes (LED) and are commonly constructed as PN junctions wherein the injection of minority carriers into a conductivity type region provides the basis for carrier recombination and gives rise to a narrow band of radiation.

Visual observation of light emitted from metal-oxide-metal (M—O—M) sandwiches resulted from early work by J. F. DeLord et al, described in an article entitled "Correlation Between Electroluminescence and Electron Emission of Thin Metal-Oxide-Metal Sandwiches", which appeard in *Applied Physics Letters*, Volume 11, No. 9, Nov. 1, 1967, pages 287–289. In that article, thin sandwich structures of Be-BeO-Au and Al-Al$_2$O$_3$-Ag, having oxide layer thicknesses of from 100 to 150 A, were described as being constructed to investigate the nature of electron emission. A first type of luminescence was reported as being a bright irreversible disruptive flash or sparking which permanently altered the characteristics of the device. A second type of luminescence was noted as a very faint bluish glow observed at a low current level on cooled devices. The DeLord et al article concludes that electron emission from metal-oxide-metal sandwich structures was entirely due to the photoelectric effect caused by electroluminescence produced within the oxide layer.

Later work was described by H. Kanter in an article entitled "Comments on Correlation Between Electroluminescence and Electron Emission of Thin Metal-Oxide-Metal Sandwiches", which appeared in *Applied Physics Letters*, Volume 12, No. 8, Apr. 15, 1968, pages 243–244. That article indicated Al-Al$_2$O$_3$-Au structures, having oxide layer thicknesses of 100 A, produce electron current dominated by photoelectron emission released in the top layer through electroluminescence radiation within the oxide at large field strengths created by high voltages in excess of 8 volts.

SUMMARY OF THE INVENTION

As noted in our article entitled "Light Emission From Inelastic Electron Tunneling", published in the *Physical Review Letters*, Volume 37, Oct. 4, 1976, pages 923–925, and incorporated herein by reference, the present invention yields a broad-band light source with a high frequency linear cutoff value that is dependent upon the applied voltage through the quantum relation $hv_{co} = |eV|$. The light source is constructed as a metal-insulator-metal tunneling junction, which, when activated by an applied voltage, emits a broad-band of radiation uniformly over the junction area regardless of the polarity of the applied voltage. Light emission from the counter-electrode of the junction is due to inelastic tunneling through a relatively thin oxide insulator, and optical output coupling of surface plasmon modes in the junction is achieved by roughing or etching the counter-electrode to render it slightly porous.

Our later article entitled "Enhancement of light emission from metal-insulator-metal tunnel junctions", which appeared in *Applied Physics Letters*, Volume 30, No. 8, Apr. 15, 1977, pages 427–429 and incorporated herein by reference, indicated that optical output coupling could be improved by utilizing an external coupling mechanism. The junction was formed with a smooth counter-electrode and then coated with a relatively thin insulating layer on its external surface. Subsequently, a layer of small metal particles was formed on the external insulating layer. The external insulating layer and particle layer formed the external coupling mechanism, wherein the particles were found to act as scattering centers for the electromagnetic energy generated in the junction by the tunneling current.

Although the last mentioned article indicated operation at 77° K., it was subsequently discovered that the external coupling mechanism also functioned with improved junction stability and long life for operation at room temperatures. The inventors attribute this stable room temperature operation as being due to the smoothness of the metal-insulation-metal elements used to form the tunnel junction, being combined with the external plasmon mode coupling feature.

Accordingly, it is an object of the present invention to provide an improved solid state source of broadband radiation having an upper cutoff frequency value which is a function of the value of voltage applied to that source.

It is another object of the present invention to provide a solid state light source that provides an enhanced broadband spectra of radiation determined by the value of voltage applied thereto.

It is a further object of the present invention to provide a metal-insulator-metal tunneling junction whereby light is emitted and efficiently coupled therefrom as a result of inelastic tunneling, which is nondestructive to the junction.

It is a still further object of the present invention to provide an improved room temperature light source in which the upper cutoff frequency can be controlled by corresponding control of the applied voltage value.

It is a further object of the present invention to provide a method of constructing a stable, room temperature light source that comprises a metal-insulator-metal junction having small metal particles deposited over the counter-electrode to provide enhanced optical output coupling of surface plasmon modes in the junction.

DETAILED DESCRIPTION OF THE INVENTION

The present invention is an improved light source in the form of a metal-insulator-metal tunnel junction. In this junction, a smooth external electrode of approximately 80 A and termed a "counter-electrode" is coated with an insulating spacer layer of $MgF_2$ having a thickness of approximately 50 A. Silver is then evaporated onto the junction to a thickness of approximately 100 A. The silver coating is then annealed at about 200° C. for a short time (about 10 minutes). This treatment alters the shape of the silver coating into small silver particles and results in an external output coupling mechanism which exhibits a dipole scattering resonance in the visible.

Figure 1:
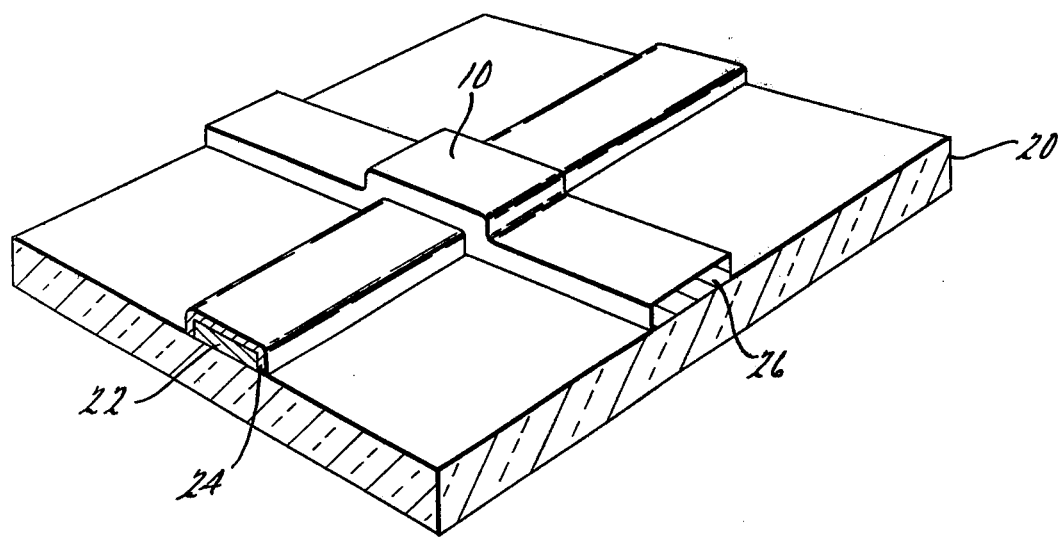
FIG. 1 illustrates the basic metal-insulator-metal tunnel junction structure of the present invention.
Figure 2:
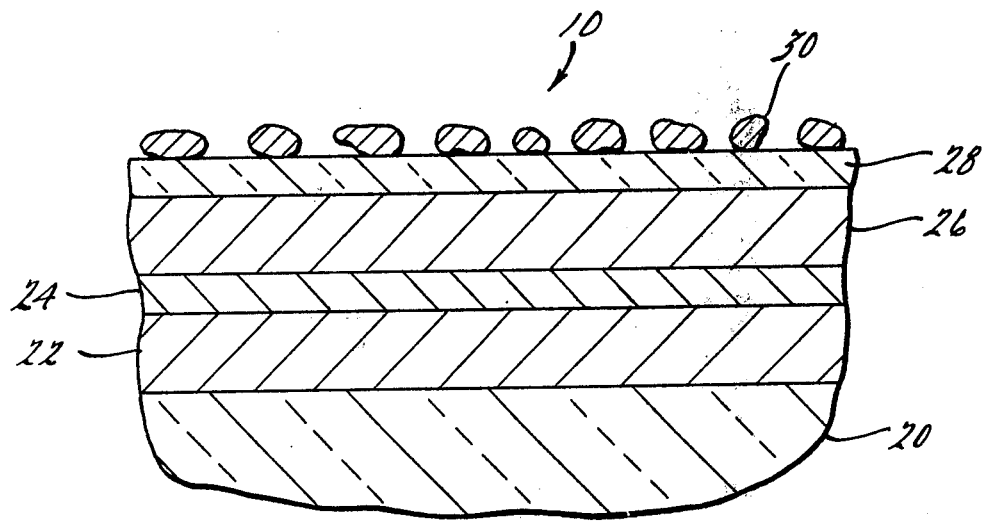
FIG. 2 illustrates a cross-section of the improved structure in which small particles are placed over the smooth counter-electrode to obtain optical output coupling.

As shown in FIGS. 1 and 2, a substrate 20 is a support structure for the junction having a first metal electrode 22 deposited thereon. A relatively thin insulating layer 24 covers the first electrode 22 and a counter-electrode 26 is cross-oriented to define the junction area 10. The improvement is shown in FIG. 2, wherein an additional insulator layer 28 is deposited on the counter-electrode 26, and silver particles 30 are formed on the insulator layer 28. In operation, voltage, within a predetermined range, is applied between the first electrode and the counter-electrode. Inelastic tunneling then occurs in this junction because of the relatively thin insulator layer between the two electrodes. The particles are excited and act as radiative oscillators to output couple otherwise non-radiative fields and make them radiative.

Fabrication of the solid state source of radiant energy, schematically illustrated in FIG. 1, is performed in a manner similar to the fabrication of the tunnel junction described in commonly assigned U.S. Pat. No. 3,469,184. It is also anticipated by the inventors that many junctions may be fabricated in an addressable matrix format for large scale integration (L.S.I.), since the junctions are ideally suited for formation on silicon wafers and compatible with that technology.

In the preferred embodiment, aluminum was selected as a first metal electrode 22 to be evaporated onto the support substrate 20, such as silicon, because of its high optical reflectivity and low electrical resistance. Samples of the junction were fabricated having aluminum film thicknesses ranging from approximately 200 to 1000 A and found to have favorable performance characteristics. Following the formation of the first electrode film 22, an insulating layer 24 was formed thereon. Since aluminum was selected as the first electrode 22 of the preferred embodiment, the aluminum film was oxidized in order to form an optically nonabsorbing insulating layer 24 of $Al_2O_3$. An insulating layer having a thickness of approximately 30 A was found to be adequate to withstand voltages of up to 4 volts and to conduct sufficient tunneling current so that light was observed.

Following the formation of the insulating layer 24, a non-porous counter-electrode 26 having a continuously smooth thickness in the range of approximately 80–300 A was evaporated over a portion of the insulating layer, at room temperature. It has been found that counter-electrodes of Ag, Au, Pb or In are operational. However, Au is presently preferred because of its high stability and long life. Following the formation of the counter-electrode 26, wherein the common area of insulating layer and first electrode overlayed by the counter-electrode forms the tunnel junction 10, an insulating spacer layer 28 of $MgF_2$ or $SmO_2$ is formed having a thickness of approximately 50 A. Subsequently, silver particles are formed as mentioned above, and the junction is ready for room temperature operation.

In our parent application, Ser. No. 836,624, referred to above, the counter-electrode material was etched by exposing the counter-electrode to a 0.01% solution of Br in carbon tetrachloride at room temperature, for approximately 15 seconds. The junction was then removed to the atmosphere and heated to approximately 150° C. for approximately 1 minute. The heating of the junction caused a decrease in the tunneling conductance and thus limited the current at a peak bias voltage of approximately 4 volts.

When voltage is applied to the electrodes 22 and 26 of either the earlier dislosed junction with an etched counter-electrode or the presently disclosed junction having an external coupling mechanism, visible light emanates from the entire junction area 10 and the emission is observed to change through a spectra from deep red, at low voltage, to orange to bluewhite as the voltage is increased.

We believe that the light emission is due to inelastic tunneling in the junction (LEIT) and is due to tunneling electrons which excite an optically coupled surface plasmon mode in the junction with a frequency $\nu$, provided that $|eV| \geq h\nu$. Such a notion presumes that a threshold is established for inelastic tunneling vibrational spectra.

It has been found that, even at room temperature with the external coupling mechanism, the form of the inelastic excitation will be $L(\nu)=P(\nu,V)$ $(|V|-h\nu/e)\theta-(|V|-h\nu/e)$, where $L(\nu)$ is the number of photons emitted with frequency within the interval $d\nu$. $P(\nu,V)$ is a slowly varying function of frequency and voltage involving the density of surface modes and the inelastic excitation and radiation probabilities. $\theta(|V|-h\nu/e)$ is the step function that reflects the cutoff of photon emission at the quantum condition. Thus, a linear cutoff is predicted in the spectra as $h\nu$ approaches $|eV|$.

Figure 3:
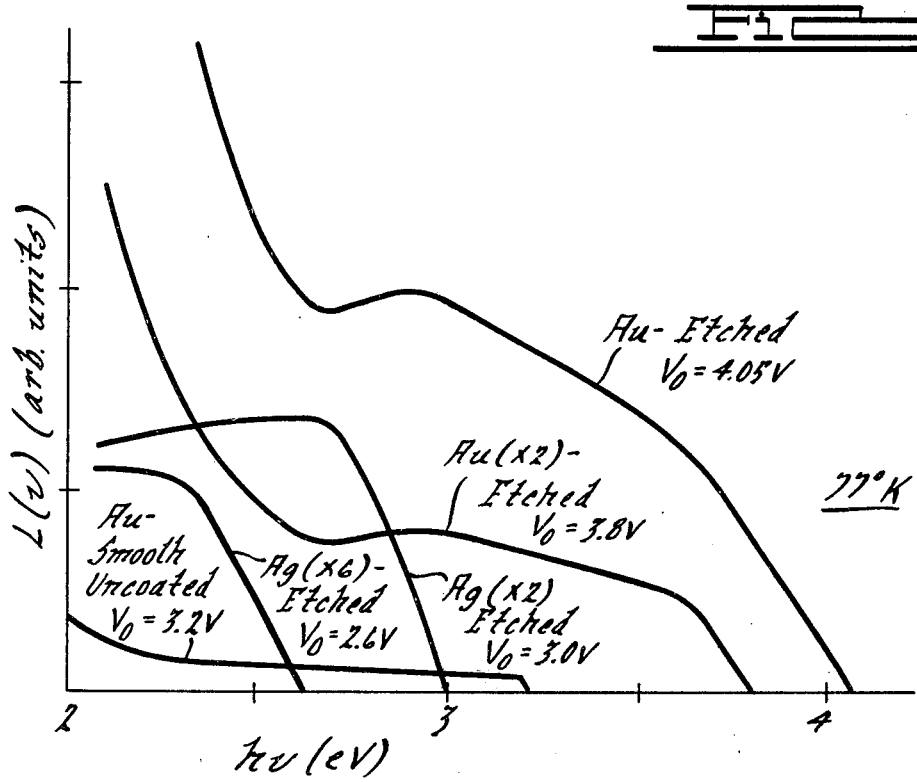
FIG. 3 is a plot of $L(\nu)$, the photon flux per unit frequency bandwidth versus $h\nu$ for Au and Ag counter-electrode junctions at different junction bias voltages.

In FIG. 3, a plot of $L(\nu)$, the photon flux per unit frequency bandwidth, versus $h\nu$ is shown for various Ag and Au, etched counter-electrode junctions for a range of junction bias voltages, when they are maintained at 77° K. Although the light emission effect is observed at room temperature for the etched counter-electrode junctions, higher stability is found to be maintained at 77° K.

As can be seen from FIG. 3, when the bias voltage $V_o$ across the tunnel junction, utilizing an etched Au counter-electrode, has a value of 3.8 volts, the frequency spectra shows a sharp cutoff frequency at approximately 3.8 electron volts. When the biasing voltage $V_o$ is changed to 4.05 volts, the frequency spectra of the tunnel junction employing the etched Au counter-electrode shows a high frequency cutoff value of approximately 4.05 electron volts. Although the measurement of L(ν) of photon flux per unit frequency bandwidth is shown in arbitrary units along the "Y" axis of the plot in FIG. 3, it can be seen that as the biasing voltage is lowered, the value of L(ν) decreases by the indicated orders of magnitude (see the parentheses following the counter-electrode element legend).

Figure 4:
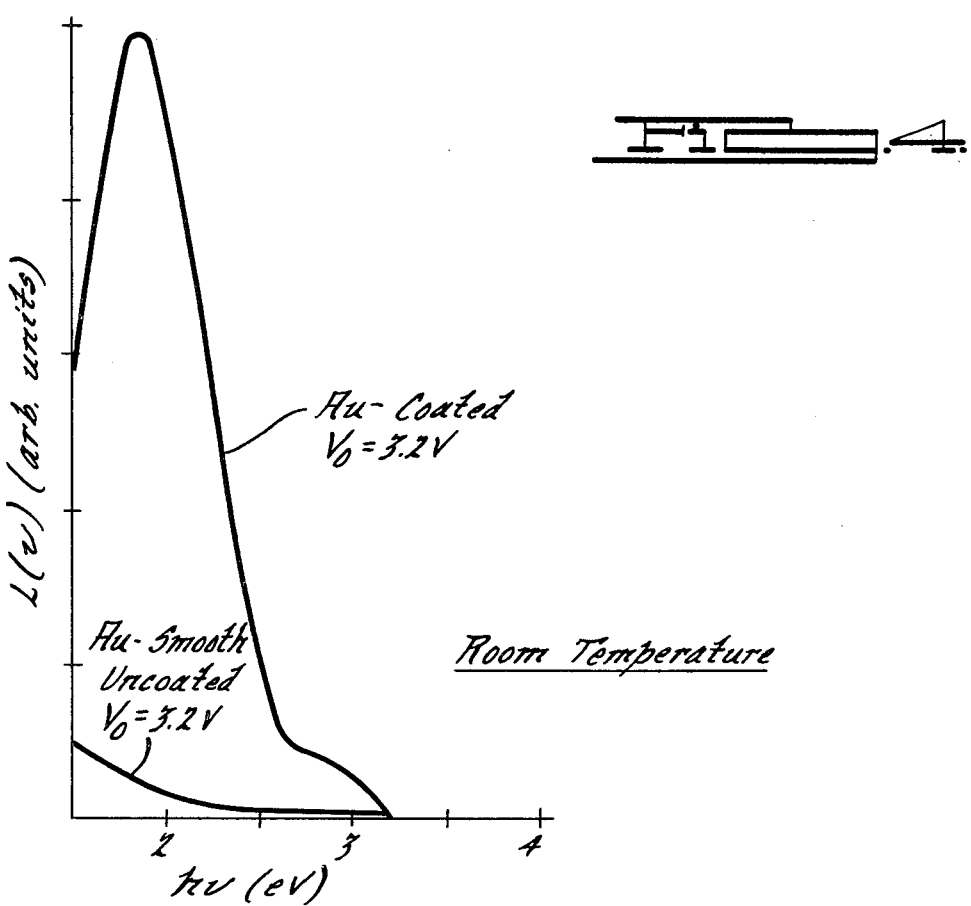
FIG. 4 is a plot of $L(\nu)$, versus $h\nu$ comparing a smooth, uncoated Au counter-electrode junction and an Au counter-electrode junction coated with small particles of Ag to illustrate the improved output coupling efficiency.

A smooth, uncoated Au counter-electrode junction is shown in both FIGS. 3 and 4 as being biased at 3.2 volts. As can be seen from FIG. 3, the photon flux per unit frequency bandwidth is significantly less than the junctions having etched counter-electrodes. This characteristic is true for both room temperature as well as 77° K. operation of the smooth, uncoated Au counter-electrode junction, since no coupling mechanism is employed to cause the non-radiative fields above the junction to made radiative.

FIG. 4 further illustrates the relationship between plots for the Au uncoated counter-electrode junction and an Au counter-electrode junction coated with the external coupling mechanism of the present invention. The external coupling mechanism used in the plotted sample comprises a 50 A coating of $MgF_2$ and a layer of Ag particles, as described above. Since the particle layer has a scattering resonance character, the FIG. 4 plot shows a corresponding peak emission frequency.

The improved intensity results are indicated in FIG. 4 where the smooth Au counter-electrode junction is employed with an external coupling mechanism. In that case, when a biasing voltage Vo of 3.2 volts, for example, is applied across the junction, the corresponding high frequency cutoff value of the radiated spectra is seen at 3.2 electron volts. However, improved stability, and long life at room temperature operation are seen as the major advantages contributed by the external coupling mechanism of the present invention.

It will be apparent to those skilled in the art that many modifications as to the particular materials and elemental configurations may be made without departing from the scope of this basic invention. Therefore, the foregoing embodiments of the present invention should be interpreted as being examples of the preferred mode known at this time and not restrictive of the scope of the appended claims.

We claim:

1. An improved solid state source of visible radiant energy comprising:
    a first electrode element;
    an insulating layer overlying said first electrode element; and
    a counter-electrode overlying said insulating layer to form a tunnel junction which generates surface plasmon modes in response to voltage applied between said first electrode and said counter-electrode;
    wherein said improvement includes means external to said junction for providing optical output coupling of said surface plasmon modes in a visible light spectra having a high frequency cutoff $\nu_{co} = |eV|/h$, wherein h is the Planck constant, e is the electron charge and V is the value of the applied voltage.

2. A solid state source as in claim 1, wherein said counter-electrode has a relatively smooth outer surface, and said coupling means is formed on said outer surface of said counter-electrode.

3. A solid state source as in claim 2, wherein said coupling means comprises a layer of metal particles separated from said outer surface of said counter-electrode by a layer of insulating material.

4. A solid state source as in claim 3, wherein said metal of said metal particle layer is Ag and said material of said insulating layer on said outer surface of said counter-electrode is selected from the group consisting of $MgF_2$ and $SmO_2$.

5. A solid state source as in claim 4, wherein said outer surface insulating layer is $MgF_2$ having a thickness of approximately 50 A.

6. A solid state source as in claim 2, wherein said coupling means is formed by a method including the following steps:
    depositing a 50 A layer of $MgF_2$ on the outer surface of said counter-electrode;
    depositing a 100 A layer of Ag on said $MgF_2$ layer; and
    annealing said junction at approximately 200° C. for approximately 10 minutes to alter said silver layer into small silver particles.

* * * * *